(12) United States Patent
Zhang et al.

(10) Patent No.: US 9,260,962 B2
(45) Date of Patent: Feb. 16, 2016

(54) REDUCING DISTORTION IN AMPLIFIED SIGNALS IN WELL LOGGING TOOLS

(71) Applicant: Halliburton Energy Services, Inc., Houston, TX (US)

(72) Inventors: Dalong Zhang, Sugarland, TX (US); George David Goodman, Houston, TX (US); Abdul Qadir Shabbir, Singapore (SG)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

(21) Appl. No.: 14/363,755

(22) PCT Filed: Aug. 15, 2013

(86) PCT No.: PCT/US2013/055206
§ 371 (c)(1),
(2) Date: Jun. 6, 2014

(87) PCT Pub. No.: WO2015/023284
PCT Pub. Date: Feb. 19, 2015

(65) Prior Publication Data
US 2015/0084782 A1 Mar. 26, 2015

(51) Int. Cl.
*G01V 3/00* (2006.01)
*G01V 5/04* (2006.01)
*G01V 5/08* (2006.01)
*E21B 47/12* (2012.01)
*G01V 1/36* (2006.01)
(Continued)

(52) U.S. Cl.
CPC . *E21B 47/12* (2013.01); *G01V 1/36* (2013.01); *G01V 1/44* (2013.01); *G01V 1/46* (2013.01)

(58) Field of Classification Search
CPC .......................................................... G01V 3/00
USPC ..................................................... 340/853.2
See application file for complete search history.

(56) References Cited

U.S. PATENT DOCUMENTS 3,383,618 A * 5/1968 Engelbrecht ................. 330/149
3,411,079 A * 11/1968 Palatinus ...................... 324/624
(Continued)

FOREIGN PATENT DOCUMENTS

FR         2951554       4/2011
WO   WO 2011/103066    8/2011
WO   WO 2012/166100   12/2012

*Primary Examiner* — Jennifer Mehmood
*Assistant Examiner* — John Mortell
(74) *Attorney, Agent, or Firm* — Benjamin Fite; Fish & Richardson P.C.

(57) ABSTRACT

Technologies are described for reducing distortion in amplified signals in well logging tools based on spectral analyses of the amplified signals. For example, a system includes a well logging tool. The well logging tool includes an excitation source to direct an excitation signal towards an environment adjacent a wellbore and a receiver to amplify a probe signal received from the environment adjacent the wellbore in response to the excitation signal. The system also includes a feedback module to receive the amplified signal. The feedback module includes a spectrum analyzer module to spectrally analyze the amplified signal to generate spectral information of the amplified signal; and a controller module to determine, from the spectral information, whether the amplified signal includes distortion, and if so, to issue a feedback signal to the excitation source or the receiver to cause at least a reduction of the distortion in the amplified signal.

20 Claims, 8 Drawing Sheets

(51) Int. Cl.
*G01V 1/44* (2006.01)
*G01V 1/46* (2006.01)

(56) References Cited

U.S. PATENT DOCUMENTS

| | | | |
|---|---|---|---|
| 3,900,733 A | 8/1975 | Seeman | |
| 4,053,767 A * | 10/1977 | Kampfer et al. | 250/252.1 |
| 4,106,022 A * | 8/1978 | Last | 342/394 |
| 4,621,264 A | 11/1986 | Yashiro et al. | |
| 4,814,768 A * | 3/1989 | Chang | 342/22 |
| 5,453,716 A | 9/1995 | Person et al. | |
| 5,504,479 A | 4/1996 | Doyle et al. | |
| 5,537,479 A | 7/1996 | Kreisel et al. | |
| 5,881,310 A * | 3/1999 | Airhart et al. | 710/3 |
| 6,154,550 A | 11/2000 | Beyer | |
| 6,163,259 A * | 12/2000 | Barsumian et al. | 340/572.2 |
| 7,753,847 B2 | 7/2010 | Greenleaf et al. | |
| 8,054,212 B1 | 11/2011 | Holly et al. | |
| 8,216,161 B2 * | 7/2012 | Darlington et al. | 601/2 |
| 2005/0054928 A1 | 3/2005 | Cerofolini | |
| 2006/0102345 A1* | 5/2006 | McCarthy et al. | 166/250.1 |
| 2010/0110831 A1* | 5/2010 | Love et al. | 367/32 |
| 2011/0108720 A1* | 5/2011 | Ford et al. | 250/262 |
| 2011/0280103 A1* | 11/2011 | Bostick, III | 367/35 |

* cited by examiner

REDUCING DISTORTION IN AMPLIFIED SIGNALS IN WELL LOGGING TOOLS

CLAIM OF PRIORITY

This application is a U.S. National Stage of PCT/US2013/055206 filed on Aug. 15, 2013.

BACKGROUND

The subject matter of this disclosure is generally related to techniques and tools used in well logging, particularly in oil and natural gas exploration and production. Well logging tools probe geologic formations using probe signals, and determine characteristics of the formations based on interaction between the probe signals and the formations. More specifically, the present technologies relate to amplifying the probe signals and to reducing distortion in the amplified signals.

Well logging refers to the practice of recording information about geological formations penetrated by a wellbore and/or about fluids found within the wellbore. Wireline logging refers to well logging that is performed by lowering a well logging tool on the end of a wireline into the wellbore and recording petrophysical properties using a variety of sensors. Well logging can be performed after the wellbore has been completed or during the drilling process (referred to as "logging while drilling").

Information obtained from wireline logging may be used for a variety of purposes including, for example, deciding whether to continue at a current drilling location or to choose a subsequent drilling location, or to determine the location of a drill bit (e.g., a depth under the earth surface) and the direction that drilling should follow.

Logging tools can be used to probe a variety of characteristics of the geological formations penetrated by a well. A logging tool can be a resistivity tool, a density tool, a sonic or acoustic tool, or an imaging tool respectively operated with audio frequency, gamma, sound or radar frequency signals. The information generated by the logging tool about a geological formation is derived through the interaction of probe signals with that formation. Typically, a probe signal is launched by an excitation source of the logging tool into a wellbore fluid, a geological formation or both, and a receiver of the logging tool is used to measure a characteristic of the probe signal such as, for example, an amount of time required by the probe signal to travel a given distance into the fluid and/or formation, or an attenuation of the probe signal over the traveled distance.

When a linear amplifier of a logging tool is operated in a linear amplification range, an amplified signal is a direct, linear function of the probe signal that is input to the linear amplifier: amplified signal=(amplifier gain)×(input probe signal). Linearity refers to the ability of the amplifier to produce amplified signals that are accurate copies of the input probe signal, generally at increased powers. Neither clipping nor distortion (harmonic distortion or intermodulation distortion) occurs when the linear amplifier is operated in the linear amplification range (although random noise may still be introduced).

DESCRIPTION OF DRAWINGS

Like reference symbols in the various drawings indicate like elements.

DETAILED DESCRIPTION

Figure 1A:
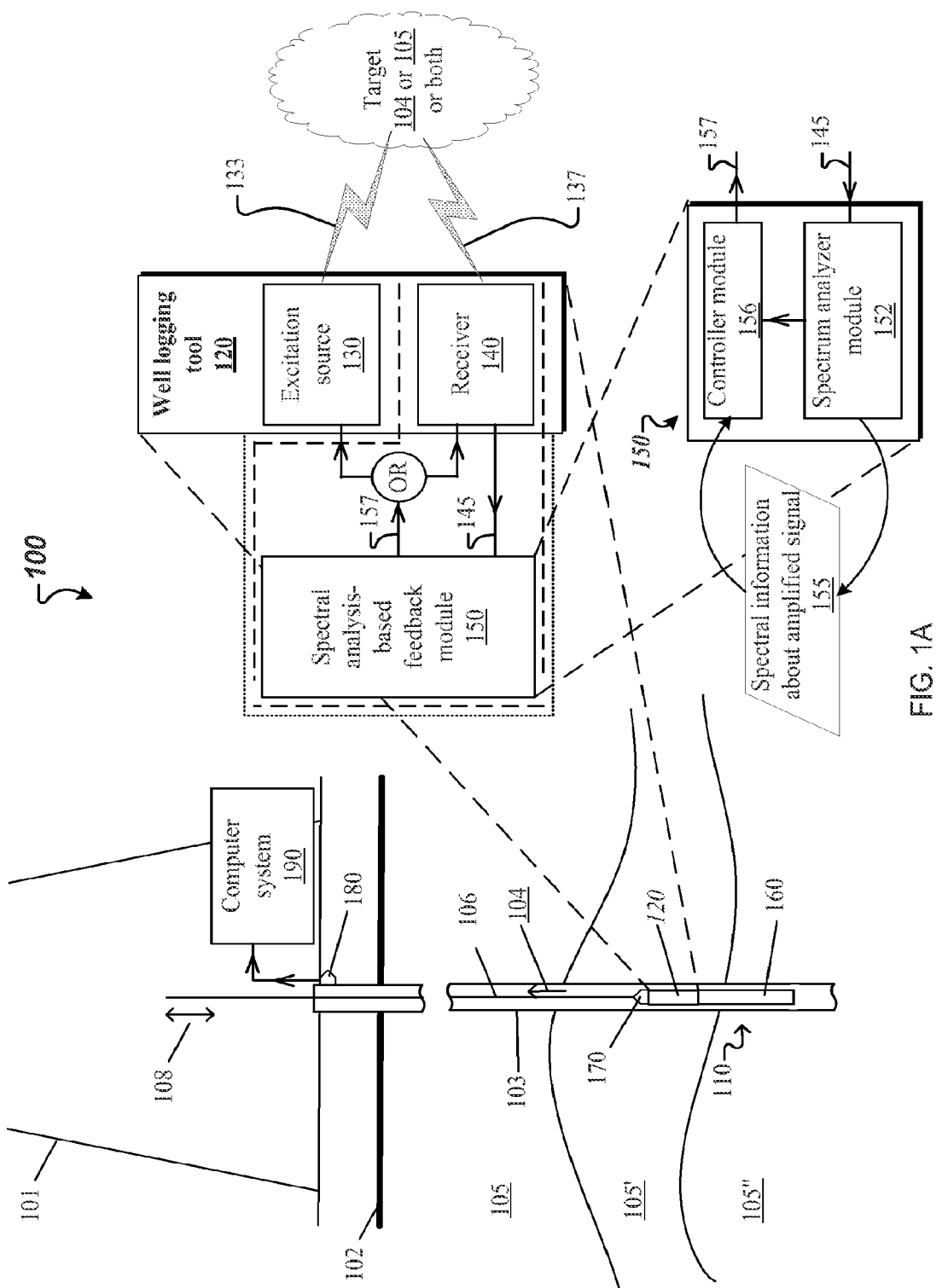
FIGS. 1A-1C show multiple configurations of an example of a system for analyzing wellbore fluids and/or geologic formations that uses a well logging tool configured with spectral analysis-based feedback.

This specification describes well logging tools used to receive a probe signal modified by a target (e.g., a wellbore fluid, a geological formation or both), and to amplify the received signal. Prior to amplification, the signal includes one or more tones (i.e., frequencies). Spectral analyses of distortion of the amplified signal (e.g., due to clipping of the amplified signal) are used by the well logging tools to control a level of the amplified signal. In this manner, the disclosed well logging tools can be used in critical downhole applications. For example, the disclosed technologies are applied in cases where a well logging tool changes its linear amplification range over time or temperature or both. As another example, the disclosed technologies are applied in cases when a probe signal used by the well logging tool transitions from sampling a geological formation to sampling a different geological formation, and hence modification of the signal strength or amplifier gain is needed to maintain optimal operation.

In cases when a probe signal, in the form of a pure sine wave, is input to a linear amplifier of a well logging tool, the disclosed technologies are used to detect signal clipping and/or other distortions of a signal output by the linear amplifier (referred to as the amplified signal). Since the sine wave has a spectrum with just one fundamental frequency component, clipping of the amplified signal is detected by analyzing a spectrum of the amplified signal at frequency components other than the fundamental frequency component. In cases when a multi-tonal probe signal, which has a spectrum consisting of multiple fundamental frequency components, is input to the linear amplifier, the disclosed technologies are used to detect distortions of the amplified output signal by analyzing a spectrum of the amplified signal at frequency components corresponding to sum and/or difference of the fundamental frequency components.

Conventional techniques of identifying distortions, e.g., by clipping, are based on comparing a level of an amplified signal to a fixed reference voltage level. In well logging tools, however, amplifiers and their associated circuitries may change their performance over time and temperature making it difficult to maintain optimal amplification of a detected signal based on conventional reference voltage level techniques. Amplifier linearity is also affected by signal amplitude that constantly changes as a result of the logging environment. For example, a logging tool used to measure conductivity of geologic formations may have its receiver's gain set to a level adequate for measuring a geologic formation with low conductivity. However, when logging past a highly conductive geologic formation the disclosed technologies prevent lost information due to large signal compression in the receiver.

Moreover, the disclosed techniques can allow maximizing the efficacy of well logging tools since power amplifiers and receivers can be used to their maximum level of performance. The disclosed technologies provide higher efficiency of power transmission systems and higher accuracy of measurement systems than their conventional counterpart systems since a linear range of the disclosed systems is used to the maximum. Additionally, the well logging tools described in this specification can lower distortion levels at the output thereof. In this manner, the disclosed technologies can reduce measurement errors caused by distortion providing optimal signal-to-noise measurement results.

Figure 1C:
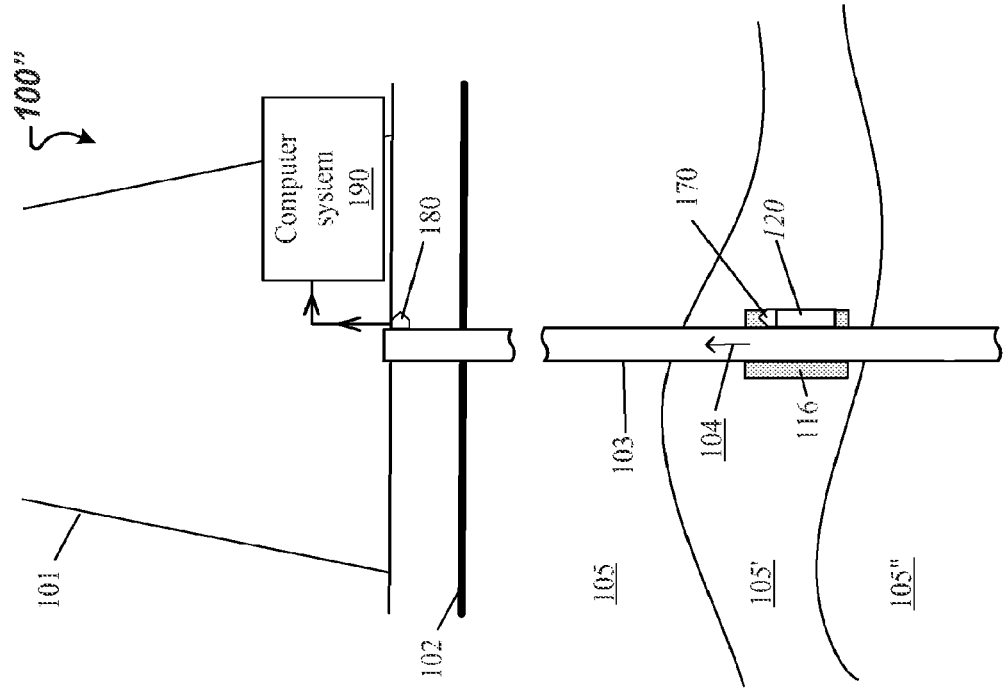
Figure 1B:
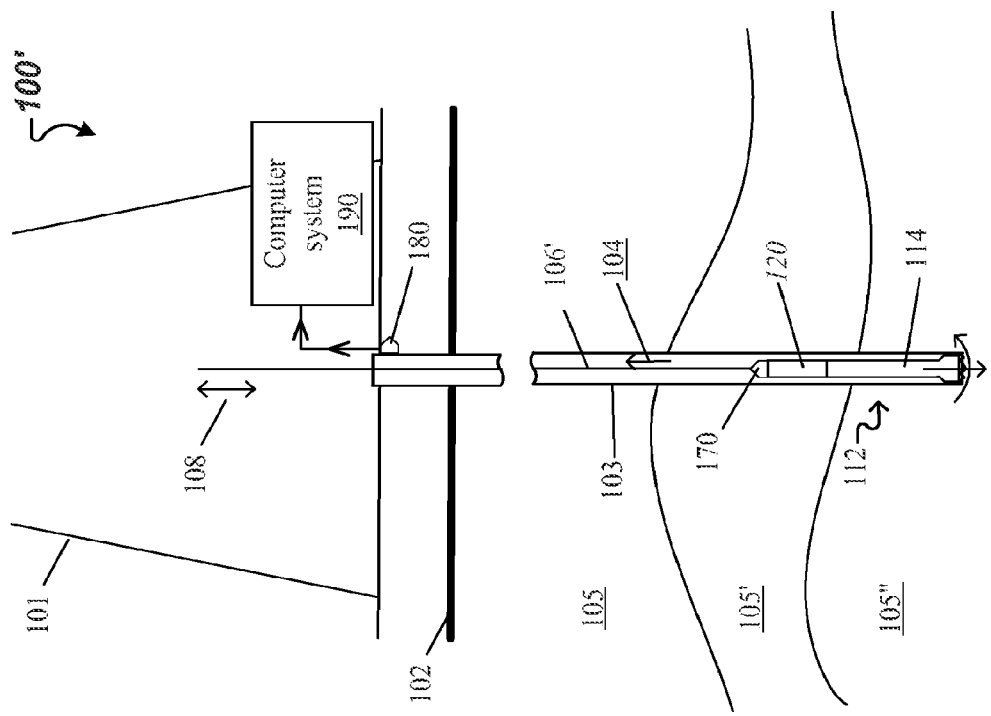

FIGS. 1A-1C show multiple configurations 100, 100', 100" of an example of a system for analyzing wellbore fluids 104 and/or geologic formations 105, 105', 105", such that the analysis is generated from measurements taken with a well logging tool 120 configured with spectral analysis-based feedback. The disclosed system also is referred to as a well logging system.

Each of the configurations 100, 100', 100" of the well logging system illustrated in FIGS. 1A-1C includes a rig 101 above the ground surface 102 and a wellbore 103 below the ground surface. The wellbore 103 extends from the ground surface into the earth and generally passes through multiple geologic formations 105, 105', 105", etc. In general, the wellbore 103 can contain wellbore fluids 104. The wellbore fluids 105 can be crude petroleum, mud, water or other substances and combinations thereof. Moreover, the wellbore fluids 104 may be at rest, or may flow toward the ground surface 102, for instance. Additionally, surface applications of the well logging tool 120 may include water monitoring and gas and crude transportation and processing.

FIG. 1A shows a configuration 100 of the well logging system which includes a tool string 110 attached to a cable 106 that can be lowered or raised in the wellbore 103 by draw works 108. The tool string 110 includes measurement and/or logging tools to generate and log information about the wellbore fluids 104 in the wellbore 103, and/or about the geologic formations 105, 105', 105" outside of the wellbore 103. In the configuration 100 of the well logging system, this information can be generated as a function of a distance (e.g., a depth) with respect to the ground surface 102. In the example illustrated in FIG. 1A, the tool string 110 includes the well logging tool 120, one or more additional well logging tool(s) 160, and a telemetry transmitter 170. Each of the well logging tools 120 and 160 measures one or more properties of the wellbore fluids 104 and/or of the geologic formations 105, 105', 105". In some implementations, the well logging tool 120 determines values of the one or more properties in real time and reports those values instantaneously as they occur in the flowing stream of wellbore fluids 104, and/or in the formations 105, 105', 105", sequentially to or simultaneously with other measurement/logging tools 160 of the tool string 110.

FIG. 1B shows another configuration 100' of the well logging system which includes a drilling tool 112 attached to a drill string 106'. The drilling tool 112 includes a drill bit 114, the well logging tool 120 configured as a measurement while drilling (MWD) and/or logging while drilling (LWD) tool, and the telemetry transmitter 170. Drilling mud is provided through the drill string 106' to be injected into the borehole 103 through ports of the drill bit 114. The injected drilling mud flows up the borehole 130 to be returned above the ground level 102, where the returned drilling mud can be resupplied to the drill string 106' (not shown in FIG. 1B). In this case, the MWD/LWD-configured well logging tool 120 generates and logs information about the wellbore fluids 104 (e.g., drilling mud), and/or about the geologic formation 105" (or 105, 105') adjacent the working drill bit 114.

FIG. 1C shows yet another configuration 100" of the well logging system which includes a permanent installation adjacent to the borehole 103. In some implementations, the permanent installation is a set of casing collars that reinforce the borehole 103. In this case, a casing collar 116 from among the set of casing collars supports the well logging tool 120 and the telemetry transmitter 170. In this manner, the well logging tool 120 determines and logs properties of the wellbore fluids 104 and of the formation 105' (or 105, 105") adjacent the underground location of the casing collar 116.

In each of the above configurations 100, 100' and 100" of the well logging system, the values of the one or more properties measured by the well logging tool 120 are provided (e.g., as an amplified signal 145) to the telemetry transmitter 170. The latter communicates the measured values to a telemetry receiver 180 located above the ground surface 102. The telemetry transmitter 170 and the telemetry receiver 180 can communicate through a wired or wireless telemetry channel. In some implementations of the system configurations 100, 100' illustrated in FIGS. 1A and 1B, e.g., in slickline or coiled tubing applications, measurement data generated by the well logging tool 120 can be written locally to memory of the well logging tool 120.

The measured values of the one or more properties of the wellbore fluids 104 and/or of the formations 105, 105', 105" received by the telemetry receiver 180 can be logged and analyzed by a computer system 190 associated with the rig 101. In this manner, the measurement values provided by the well logging tool 120 can be used to generate physical and chemical information about the wellbore fluids 104 in the wellbore 103 and/or about the geologic formations 105, 105', 105" outside of the wellbore 103.

The well logging tool 120 includes an excitation source 130 and a receiver 140. The excitation source 130 directs an excitation signal having one or more frequencies towards the environment adjacent the wellbore 103, and the receiver 140 detects a probe signal received by the well logging tool 120 in response to the excitation signal, such that the probe signal has the same one or more frequencies as the excitation signal. In general, the form (e.g., conduction/induction/radiation/acoustic) and spectral content of the excitation signal (e.g., the one or more frequencies of the excitation signal) depends on the type of logging being performed and a nature of the environment adjacent the wellbore 103.

In some implementations, excitation signals emitted by the excitation source 130 and probe signals detected by the receiver 140 are electromagnetic (EM) waves. In some cases, the excitation signals can be EM waves that have low frequency, e.g., in an audio frequency range of 20 Hz to 30 kHz. Such excitation signals are typically referred to as audio signals. Audio signals can be used for resistivity measurements of the geologic formations 105, 105', 105". Examples of low frequency logging tools are Lateral Log and Induction class tools. In other cases, the excitation signals can be EM waves in a very high frequency (VHF) range, from 30 MHz to 300 MHz, or in an ultrahigh frequency (UHF) range, from 300 MHz to 3 GHz. Such VHF and/or UHF excitation signals can be used for micro-resistive (MR) measurements and imaging of the geologic formations 105, 105', 105". Additionally, the VHF and/or UHF excitations signals can be used for dielectric permittivity measurements of wellbore fluids 104 and geologic formations 105, 105', 105". In some other cases, the excitation signals can be EM waves in a ground-penetrating radar frequency range (e.g., typically from 1 GHz to 10 GHz). Such ground-penetrating radar excitation signals can be used for imaging fractures and features within the geologic formations 105, 105', 105". In yet some other cases, the excitation signals can be EM waves that include various types of radioactive rays, such as gamma rays. Such radioactive rays can be used for measuring porosity or lithology of the geologic formations 105, 105', 105".

In some implementations, excitation signals emitted by the excitation source 130 and probe signals detected by the receiver 140 are sound waves. In some cases, the excitation signals can be sound waves that have low frequency, e.g., in an acoustic frequency range from 20 Hz to 20 kHz. This acoustic frequency range can be used for measuring refraction properties of the excitation sound waves propagating along the borehole 103 within the geologic formations 105, 105', 105" to determine formation porosity. In other cases, the excitation signals can be sound waves that have high frequencies, e.g., in an ultrasonic frequency range from 20 kHz up to about 10 MHz. Ultrasonic probe signals can be used for borehole caliper measurements and high resolution imaging of features of the geologic formations 105, 105', 105".

In the examples shown in FIGS. 1A-1C, the excitation source 130 directs an excitation signal 133 towards the environment adjacent the wellbore 103, here referred to as a target 104/105. As such, the target 104/105 refers to the wellbore fluids 104, a geological formation 105 (or 105', or 105", etc.), or both. For example, if the wellbore 103 is empty, such that at least a portion of the excitation signal 133 returns to the receiver 140 as a probe signal 137 after having traveled a finite distance through one of the geological formations 105, 105' or 105" in the vicinity of which the well logging tool 120 is currently, then the target is the one of the geological formations 105, 105' or 105". As another example, if wellbore fluids 104 in the wellbore 103 are non-transmissive to the excitation signal 133, such that at least a portion of the excitation signal 133 returns to the receiver 140 as the probe signal 137 after having traveled a finite distance through the wellbore fluids 103 without reaching any of the geological formations 105, 105' or 105", then the target is the wellbore fluids 104. As yet another example, if wellbore fluids 104 in the wellbore 103 are at least partially transmissive to the excitation signal 133, such that at least a portion of the excitation signal 133 returns to the receiver 140 as the probe signal 137 through the wellbore fluids 103 after having reached one of the geological formations 105, 105' or 105" in the vicinity of which the well logging tool 120 is currently and traveled a finite distance through the one of the geological formations 105, 105' or 105", then the target is the wellbore fluids 104 and the one of the geological formation 105, 105' or 105".

The receiver 140 amplifies the probe signal 137 received from the target 104/105, and to output an amplified signal 145. As described above, the amplified signal 145 represents a measurement of a property of the target 104/105, in some cases. In other cases, the amplified signal 145 is combined with one or more outputs of the other well logging tools 160 of a tool string 110, so the computer system 190 can use the combined signals to generate information about chemical and/or physical information about the target 104/105. Typically, the receiver 140 includes a linear amplifier, as described below in connection with FIGS. 3 and 5A.

A feedback module 150 is communicatively coupled with the receiver 140 and optionally with the excitation source 130. In some implementations, the feedback module 150 is included in the tool string 110, and can be part of or separate from the well logging tool 120. When the feedback module 150 is included in the well logging tool 120, it can be part of or separate from the receiver 140. In other implementations, the feedback module 150 can be arranged remotely from the tool string 110. For example, the feedback module 150 is included in the computer system 190, above the ground surface 102. In this case, the feedback module 150 communicates with the receiver 140 and optionally with the excitation source 130 via the telemetry channel between the telemetry transmitter 170 and telemetry receiver 180. The feedback module 150 monitors the amplified signal 145. In some implementations, a portion of the amplified signal 145 monitored by the feedback module 150 is split off from the amplified signal 145 using a signal tap (e.g., a beam splitter).

In the examples illustrated in FIGS. 1A-1C, the feedback module 150 includes a spectrum analyzer module 152 and a controller module 156, each of which being implemented in hardware, firmware, software or combinations thereof. Additionally, the spectrum analyzer module 152 and the controller module 156 can be implemented as separate modules in communication with each other or as a single aggregated module. The spectrum analyzer module 152 spectrally analyzes the amplified signal 145 and generates spectral information 155 of the amplified signal. The spectral information 155 about the amplified signal includes a spectrum of the amplified signal. The spectrum of the amplified signal represents a spectral decomposition of the amplified signal 145 including an amplitude $A_0$ of the fundamental frequency $f_0$ of the amplified signal, an amplitude $A_2$ of the second harmonic $2f_0$, an amplitude $A_3$ of the third harmonic $3f_0$, and so on. Here, analysis of a signal, which is performed by the spectrum analyzer module 152 and results in spectral information of the signal, is referred to as spectral analysis of the signal. Moreover, analyzing a signal to generate spectral information thereof is referred to as spectrally analyzing the signal.

The controller module 156 determines, from the spectral information 155, whether the amplified signal 145 includes distortion, also referred to as distortion, and if so, to issue a feedback signal 157 to cause at least a reduction of the distortion. In some implementations, the feedback signal 157 is issued to the excitation source 130 and includes a request to decrease the excitation. In some implementations, the feedback signal 157 is issued to the linear amplifier and includes a request to decrease an amplifier gain. Alternatively, if the controller module 156 detects no distortion in the spectral information 155, it can issue another feedback signal 157 to cause an increase of the amplified signal 145. For example, the other feedback signal 157 can be issued to the linear amplifier and includes a request to increase the amplifier gain. As another example, the other feedback signal 157 can be issued to the excitation source 130 and includes a request to increase the excitation.

The well logging tool 120 configured with the spectral analysis-based feedback described in connection with FIGS. 1A-1C can be operated based on a process described below.

Figure 2A:
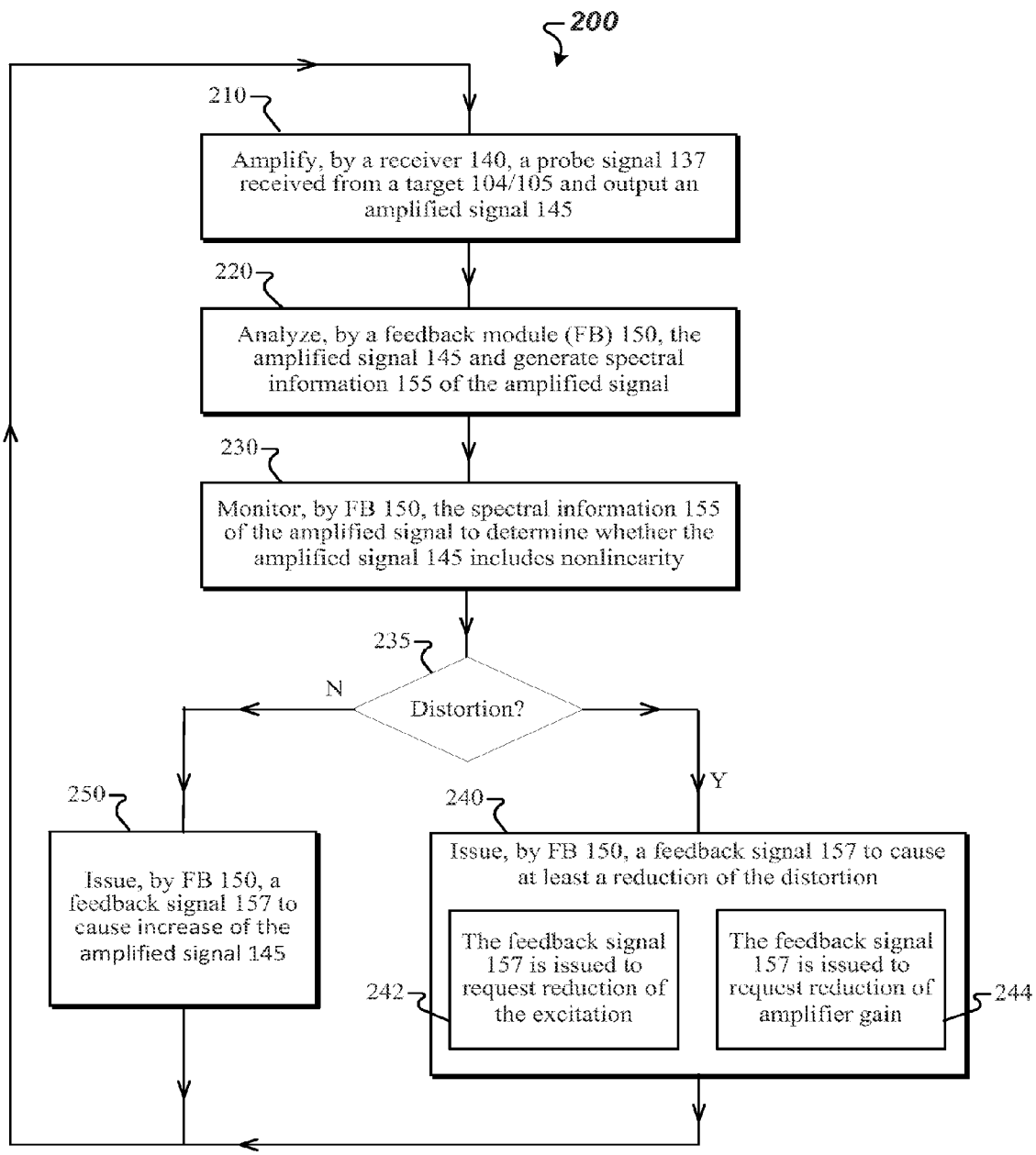
FIGS. 2A-2B are flow charts showing aspects of an example of a process for detecting distortion of an amplified signal based on spectral analysis thereof.
Figure 2B:
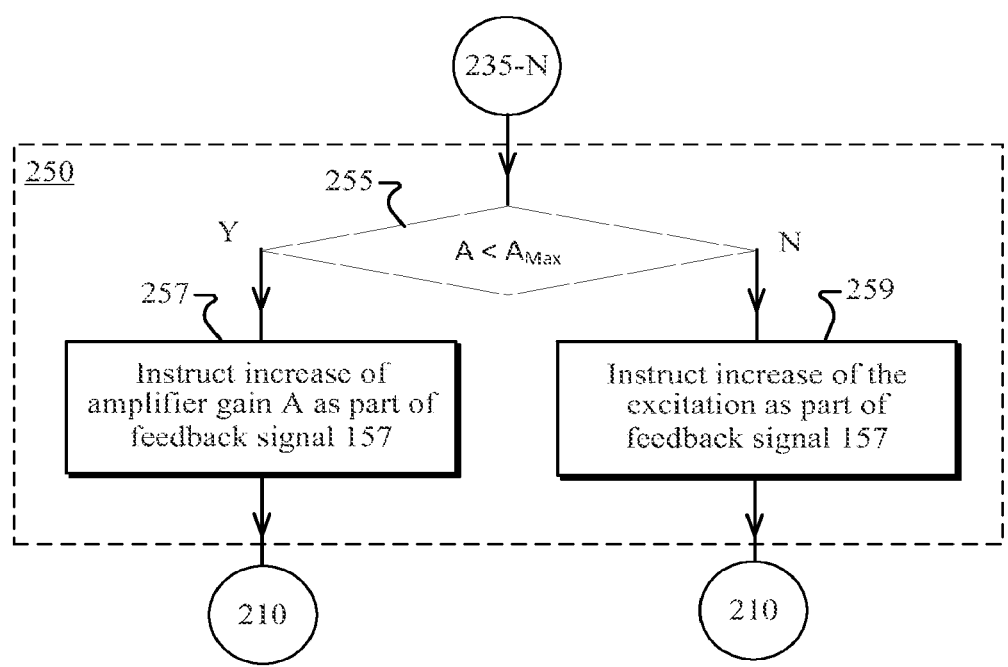

FIGS. 2A-2B are flow charts showing aspects of an example of a process 200 for detecting distortion of an amplified signal based on spectral analysis thereof. The process 200 can be implemented in the well logging system 100, 100', 100" and can be executed by the well logging tool 120, for instance.

At 210, a probe signal received from a target is amplified and output as an amplified signal. In the examples illustrated in FIGS. 1A-1C, the probe signal 137 is received from a wellbore fluid 104 or a geologic formation 105 by a receiver 140 of a well logging tool 120. In this case, the receiver 140 amplifies the probe signal 137 and outputs the amplified signal 145.

At 220, the amplified signal is spectrally analyzed and spectral information of the amplified signal is generated based on the spectral analysis. In the examples illustrated in FIGS. 1A-1C, spectral analysis of the amplified signal 145 is performed by a feedback module 150 to generate spectral information 155 of the amplified signal.

At 230, the spectral information of the amplified signal is monitored to determine whether and when the amplified signal includes distortion. In the examples illustrated in FIGS. 1A-1C, the feedback module 150 monitors the spectral information 155 to detect distortion in the amplified signal 145.

At 235, a determination can be made that distortion is present in the amplified signal. If so, at 240, a feedback signal is issued to cause at least a reduction of the distortion. In the examples illustrated in FIGS. 1A-1C, the feedback module 150 issues the feedback signal 157. In some implementations, at 242, a first type of feedback signal 157 is issued to an excitation source 130 to request reduction of the excitation. In some implementations, at 244, a second type of feedback signal 157 is issued to the receiver 140 to request reduction of amplifier gain.

Alternatively at 235, another determination can be made that distortion is absent from the amplified signal. In this alternative case, at 250, a feedback signal 157 is conditionally issued to cause an increase of the amplified signal, e.g. the amplified signal 145. In the examples illustrated in FIGS. 1A-1C, the feedback module 150 conditionally issues the feedback signal 157 in accordance with process 250, for instance.

FIG. 2B is a flowchart of the process 250. At 255, a determination can be made that an amplifier gain A is less than a maximum amplifier gain of the receiver 140. If so, at 257, the feedback signal 157 is issued to the receiver 140 to instruct an increase of the amplifier gain A, e.g., by a predetermined increment ΔA. Alternatively at 255, another determination can be made that the amplifier gain is equal to the maximum amplifier gain. If so, at 259, the feedback signal 157 is issued to the excitation source 130 to instruct an increase of the excitation, e.g., by a predetermined excitation increment.

After completion of either 240 or 250, another iteration of the process 200 can be performed by the well logging tool 120.

While the well logging system 100, 100', 100" and the process 200 represent generic implementations of the disclosed technologies, more specific implementations are described below.

Figure 3:
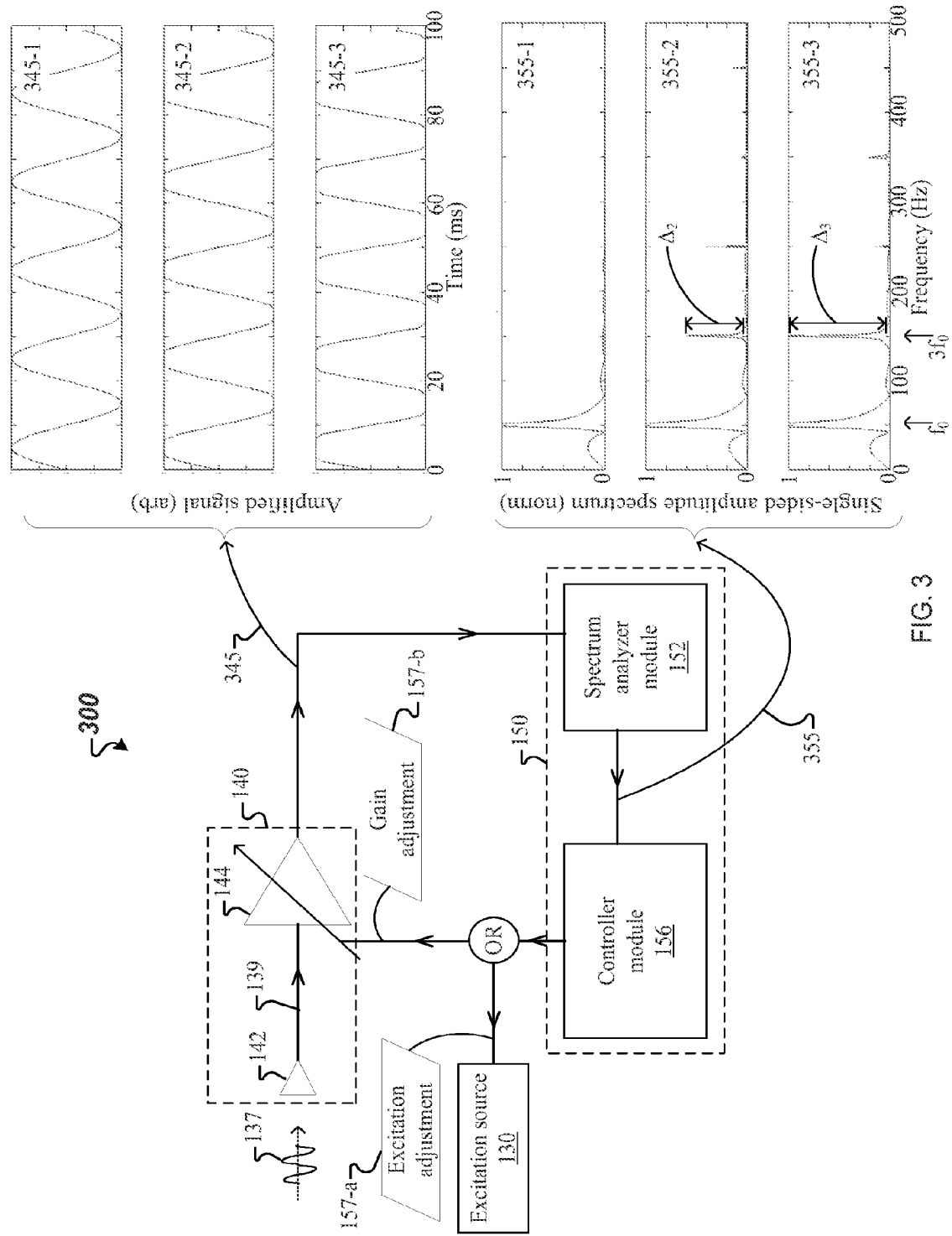
FIG. 3 shows an example of a system to amplify a single-frequency signal and to detect distortion of the amplified signal based on spectral analysis thereof.

FIG. 3 shows an example of a system 300 for amplifying a single-frequency signal and for detecting distortion of the amplified signal based on spectral analysis thereof. The system 300 can be implemented in conjunction with the well logging system 100, 100', 100" described above in connection with FIGS. 1A-1C. For instance, the system 300 can be a particular implementation of the well logging tool 120. Further in connection with FIGS. 1A-1C, the excitation signal 133 can be provided by the excitation source 130 with a single frequency $f_0$. The portion of the excitation signal 133 received by the receiver 140 after travelling a finite distance through the target 104/105 represents the single-frequency probe signal 137. Referring again to FIG. 3, the system 300 includes an excitation source (or exciter) 130, a receiver 140, and a feedback module 150.

In this example, the receiver 130 includes a probe signal detector 142 and a linear amplifier 144. Depending on the frequency range and type of the probe signal 137, the probe signal detector 142 can be an EM wave detector, e.g., an audio signal detector, a VHF/UHF antenna, a gamma-ray detector, etc., in some cases, or in some other cases, the probe signal detector 142 can be a sound wave detector, e.g., a microphone, an ultrasonic signal detector, etc. The probe signal detector 142 receives the probe signal 137 and converts it to a probe signal 139. In the example illustrated in FIG. 3, the probe signal 139 has a single frequency $f_0$. The linear amplifier 144 amplifies the probe signal 139 and to provide an amplified signal 345. In some implementations, an amplifier gain is variable and a level of the amplifier gain can be adjusted in real time based on feedback signals 157-b (e.g., instructions) received from the feedback module 150. In other implementations, an amplifier gain is preset. In the latter case, the feedback module 150 issues feedback signals 157-a to the excitation source 130.

Different levels of clipping recorded at the output of the amplifier are shown in FIG. 3. The clipping of the amplified signal 345 can be caused by an amplification gain that is too high for a given intensity of the probe signal 139, or by an intensity of the probe signal 139 that is too high for a given, fixed amplification gain. Waveform 345-1 corresponds to an amplified signal without distortion, while waveforms 345-2 and 345-3 correspond to amplified signals with increasing levels of clipping.

In this example, the feedback module 150 includes a spectrum analyzer module 152 and a controller module 156. The spectrum analyzer module 152 spectrally analyzes the amplified signal 345 and generates spectral information 355 of the amplified signal. Here, the spectral information 355 about the amplified signal includes a spectrum of the amplified signal. For example, the un-clipped amplified signal 345-1 has a spectrum 355-1 with a single spectral component at the fundamental frequency $f_0$. However, a spectrum of an overdriven linear amplifier 144 can contain an infinite number of harmonics of the fundamental frequency $f_0$. In some cases when the amplified signal 345-2, 345-3 is clipped, its spectrum contains mostly odd harmonics of the fundamental frequency $f_0$: third harmonic $3f_0$, fifth harmonic $5f_0$, seventh harmonic $7f_0$, ninth harmonic $9f_0$, and so on, each of these harmonics with an associated spectral amplitude. Frequency content for the different levels of clipping of a single frequency probe signal 137 is shown in spectra 355-2 and 355-3. A difference $\Delta_j$ (j=2, 3) in the spectral amplitude of the third harmonic, at $3f_0$, of a clipped amplified signal 345-2, 345-3 relative to the un-clipped amplified signal 345-1 can be used, by the controller module 156 in accordance with the disclosed technologies, to control operation of the system 300, since in this example the third harmonic is the spectral component that provides the largest amplitude and changes the most for different levels of clipping. For instance, $0<\Delta_2<\Delta_3$ for the spectra 355-2 and 355-3 corresponding to the clipped amplified signals 345-2 and 345-3.

In operation, a signal level at the output of the linear amplifier 144 of the receiver 140 can be continuously increased until one or more harmonics of the amplified signal 345 are detected. Detection of the harmonics represents an indication that the linear amplifier 144 is being used at the maximum linear range and the amplified signal 145 is starting to get clipped. In the example shown in FIG. 3, the distortion in the amplified signal 345 is determined by the controller module 156 when a spectral amplitude of the third harmonic component, $\Delta$, exceeds a threshold amplitude, $\Delta_0$. The threshold amplitude can be absolute, e.g., 0.5 dBV or 0.1 dBV, or relative, e.g., 10% or 2% of the amplitude of the fundamental frequency.

In some implementations, a feedback signal 157-b is provided by the controller module 156 to the linear amplifier 144, e.g., as instructions to reduce gain, such that the amplified signal 345 is maintained at the highest possible level with the lowest possible distortion. Additionally or alternatively, a feedback signal 157-a is provided by the controller module 156 to the excitation source 130, e.g., as instructions to reduce its drive level until distortion detected in the amplified signal 345 is below a threshold (given in terms of $\Delta_0$, as defined above) corresponding to the linear amplifier 144's normal linear operating range. In this manner, signal-to-noise ratio and accuracy of the linear amplifier 144 can be optimized by operating the linear amplifier 144 near its maximum gain while limiting dynamic range for the excitation source 130.

The system 300 configured with the spectral analysis-based feedback described in connection with FIG. 3 can be operated based on a process described below.

Figure 4:
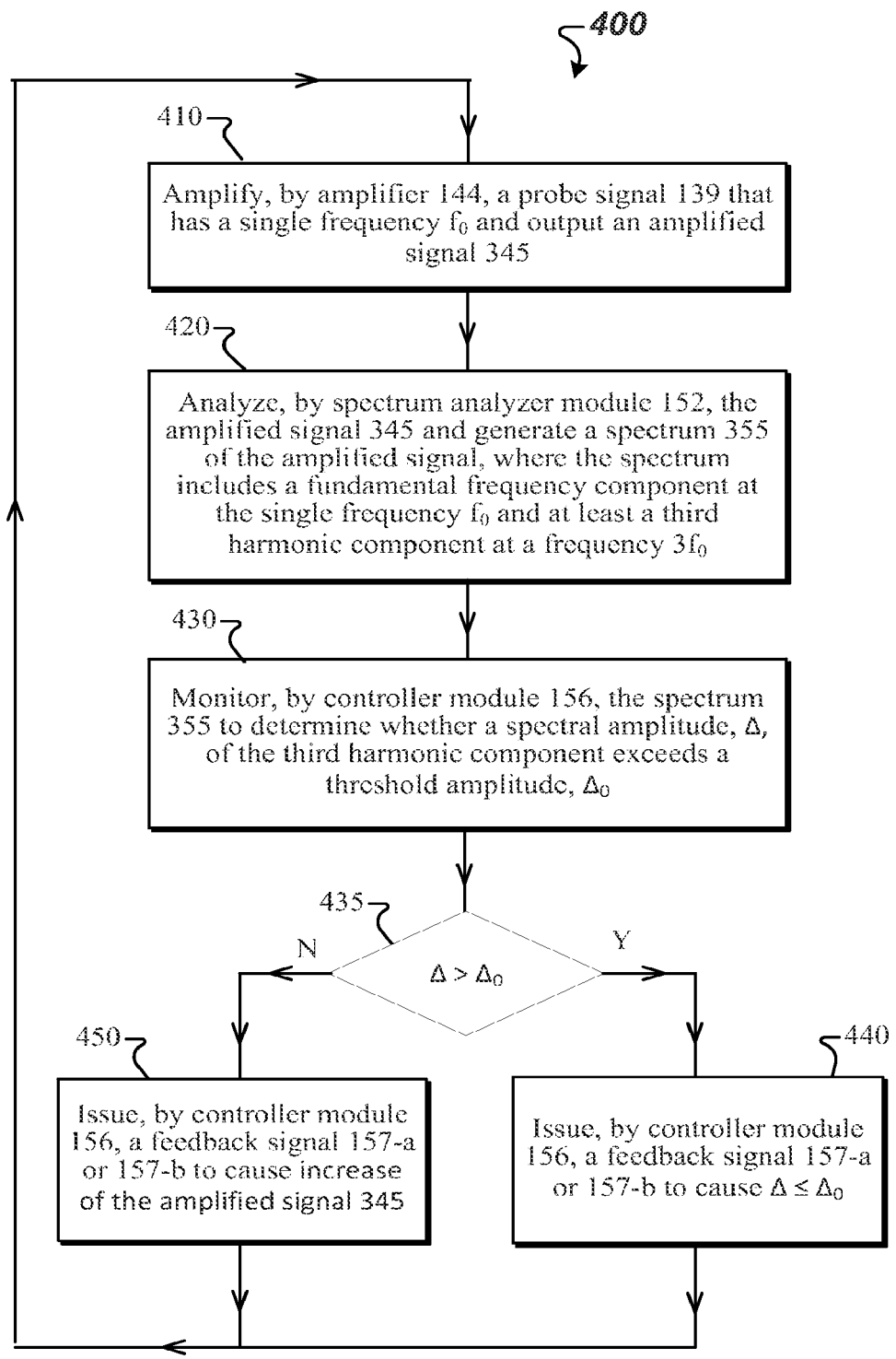
FIG. 4 is a flow chart showing an example of a process for detecting distortion of an amplified signal based on spectral analysis thereof, where the amplified signal is a result of amplification of a single-tone signal.

FIG. 4 is a flow chart showing an example of a process 400 for detecting distortion (distortion) of an amplified signal based on spectral analysis thereof, where the amplified signal is a result of amplification of a single-frequency signal. The process 400 can be implemented in the well logging system 100, 100', 100'' and/or system 300.

At 410, a probe signal that has a single frequency $f_0$ is amplified and is output as an amplified signal. In the example illustrated in FIG. 3, an amplifier 144 amplifies the probe signal 139 having the single frequency $f_0$, and outputs the amplified signal 345.

At 420, the amplified signal is spectrally analyzed and a spectrum of the amplified signal is generated based on the spectral analysis. The spectrum includes a fundamental frequency component at the single frequency $f_0$ and at least one harmonic component at a frequency equal to a multiple of the single frequency $f_0$. In some cases, the at least one harmonic component is a third harmonic of the fundamental frequency component and is located at a frequency $3f_0$. In the example illustrated in FIG. 3, spectral analysis of the amplified signal 345 is performed by a spectrum analyzer module 152 to generate a spectrum 355 of the amplified signal.

At 430, the spectrum of the amplified signal is monitored to determine whether a spectral amplitude of the at least one harmonic component exceeds a threshold amplitude. In the example illustrated in FIG. 3, a controller module 156 measures the spectral amplitude, $\Delta$, of the third harmonic component relative to the threshold amplitude, $\Delta_0$, for the spectrum 355 of the amplified signal 345.

At 435, a determination can be made that the spectral amplitude of the at least one harmonic component (e.g., the spectral amplitude $\Delta$ of the third harmonic component) exceeds the threshold amplitude (e.g., $\Delta_0$.) If so, at 440, a feedback signal is issued to cause $\Delta \leq \Delta_0$. In the example illustrated in FIG. 3, the controller module 156 issues the feedback signal. In some implementations, a first feedback signal 157-a is issued to an excitation source 130 requesting reduction of the excitation, such that the excitation reduction causes $\Delta \leq \Delta_0$. In some implementations, a feedback signal 157-b is issued to the linear amplifier 144 requesting reduction of amplifier gain, such that the amplifier gain reduction causes $\Delta \leq \Delta_0$.

Alternatively at 435, another determination can be made that the spectral amplitude of the at least one harmonic component (e.g., the spectral amplitude $\Delta$ of the third harmonic component) is less than or equal to the threshold amplitude (e.g., $\Delta_0$.) In this alternative case, at 450, a feedback signal is issued to cause an increase of the amplified signal. In the example illustrated in FIG. 3, the controller module 156 conditionally issues the feedback signal. If the amplifier gain is below a maximum value, the feedback signal 157-b is issued to the linear amplifier 144 requesting an increase of the amplifier gain, e.g., by a predetermined gain increment. Else, if the amplifier gain is at a maximum value, the feedback signal 157-a is issued to the excitation source 130 requesting an increase of the excitation, e.g., by a predetermined excitation increment.

After completion of either 440 or 450, another iteration of the process 400 can be performed by the system 300.

While the system 300 and the process 400 represent implementations used to amplify a single-tone probe signal and to detect distortion of the amplified signal based on spectral analysis thereof, other implementations of the disclosed technologies are described below.

Figure 5B:
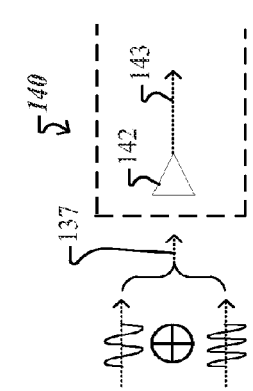
FIGS. 5A-5C show aspects of an example of a system to amplify a multi-frequency signal and to detect distortion of the amplified signal based on spectral analysis thereof.
Figure 5C:
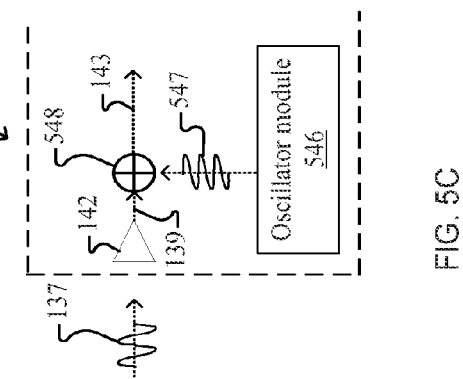
Figure 5A:
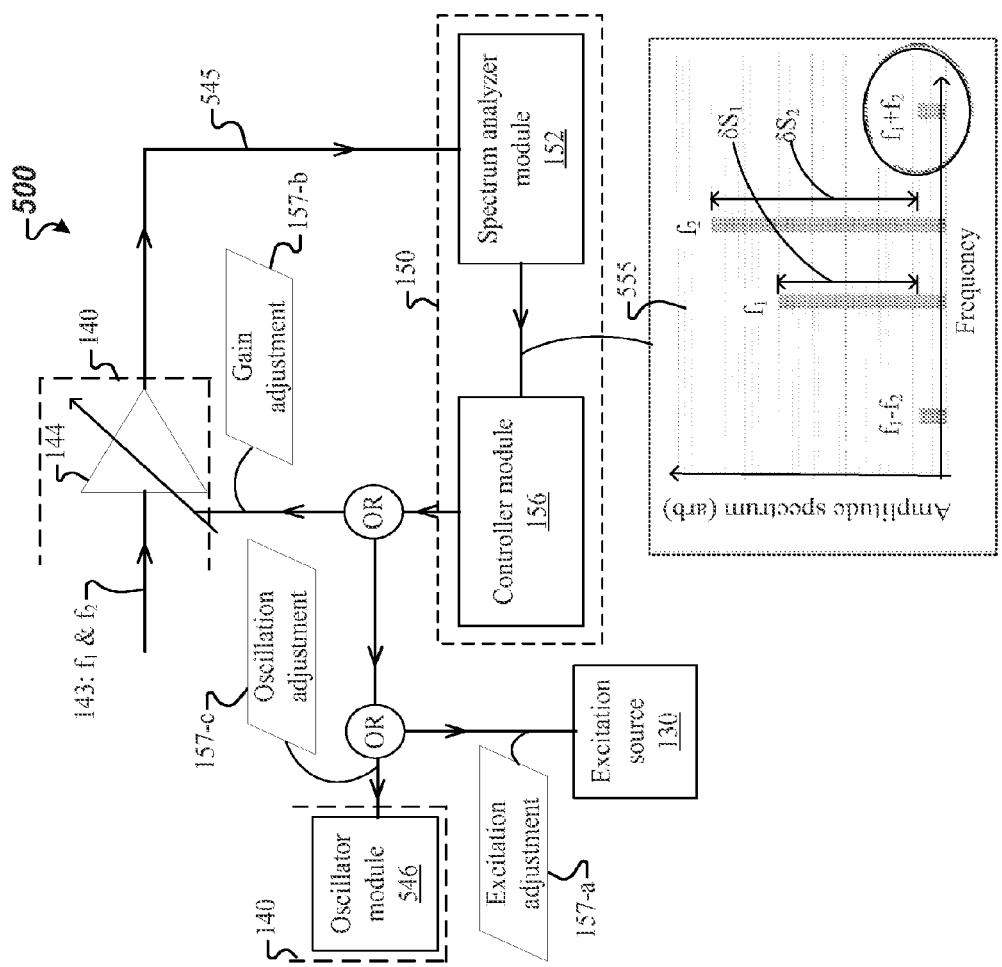

FIGS. 5A-5C show aspects of an example of a system 500 for amplifying a multi-tone probe signal 143 and for detecting distortion of the amplified signal based on spectral analysis thereof. The system 500 can be implemented in conjunction with the well logging system 100, 100', 100'' described above in connection with FIGS. 1A-1C. For instance, the system 500 can be a particular implementation of the well logging tool 120. Referring to FIG. 5A, the multi-tone probe signal 143 includes a linear combination of two fundamental frequencies, e.g., $f_1$ and $f_2$, and the system 500 includes an excitation source (or exciter) 130, a receiver 140, and a feedback module 150. The receiver 140 includes a linear amplifier 144 to amplify the two-tone probe signal 143 and to output an amplified signal 545.

FIG. 5B shows an example implementation of the receiver 140 that includes a probe signal detector 142 in addition to the linear amplifier 144. In this case, the excitation source 130 generates an excitation signal 133 as a linear combination of two fundamental frequencies, e.g., $f_1$ and $f_2$, with a desired frequency separation. For instance, $f_2 - f_1 \sim 0.05 \text{-} 0.20 \cdot f_2$. The portion of the excitation signal 133 received by the receiver 140 after travelling a finite distance through the target 104/105 represents a two-tone probe signal 137. The probe signal detector 142 receives the two-tone probe signal 137 and converts it to the two-tone probe signal 143. As described in connection with FIG. 3, depending on the frequency range and type of the two-tone probe signal 137, the probe signal detector 142 can be an EM wave detector, e.g., an audio signal detector, a VHF/UHF antenna, a gamma-ray detector, etc., in some cases, or in some other cases, the probe signal detector 142 can be a sound wave detector, e.g., a microphone, an ultrasonic signal detector, etc.

FIG. 5C shows an example implementation of the receiver 140 that includes a probe signal detector 142, an oscillator module 546 and a signal combiner 548, in addition to the linear amplifier 144. In this case, like in FIG. 3, the excitation source 130 generates an excitation signal 133 with a single frequency $f_1$. The portion of the excitation signal 133 received by the receiver 140 after travelling a finite distance through the target 104/105 represents a single-tone probe signal 137. The probe signal detector 142 receives the single-tone probe signal 137 and converts it to a single-tone probe signal 139. As described in connection with FIG. 3, the probe signal detector 142 can be an EM wave detector, e.g., an audio signal detector, a VHF/UHF antenna, a gamma-ray detector, etc., or a sound wave detector, e.g., a microphone, an ultrasonic signal detector, etc., depending on the frequency range and signal type of the single-tone probe signal 137.

The oscillator module 546 generates an oscillation 547 at a second frequency $f_2$, such that the first frequency $f_1$ and the second frequency $f_2$ satisfy $f_2 - f_1 \sim 0.05 \text{-} 0.20 \cdot f_2$. The signal combiner 548 adds the single-tone probe signal 139 at the first frequency $f_1$ with the oscillation 547 at the second frequency $f_2$, and to provide a two-tone probe signal 143 as a linear combination of two fundamental frequencies $f_1$ and $f_2$. Although in the example illustrated in FIG. 5C the oscillator module 546 and the signal combiner 548 are included in the receiver 140, in other implementations the oscillator module 546, the combiner module 548 of both can be located outside of the receiver 130, as part of the well logging tool 120, described above in connection with FIGS. 1A-1C. In some other implementations, the oscillator module 546 and the combiner module 548 can be located remotely with respect to the well logging tool 120. For example, the oscillator module 546 and the combiner module 548 can be associated with the computer system 190 and located above the ground level 102.

Referring again to FIG. 5A, an amplifier gain is variable and a level of the amplifier gain can be adjusted in real time based on feedback signals 157-$b$ (e.g., instructions) received from the feedback module 150, in some instances. In other instances, an amplifier gain is preset. In the latter case, the feedback module 150 issues feedback signals 157-$a$ (e.g., instructions) to the excitation source 130 or feedback signals 157-$c$ (e.g., instructions) to the oscillator module 546. The linear amplifier 144 operated within its dynamic range reproduces the two-tone probe signal 143, including the linear combination of two fundamental frequencies $f_1$ and $f_2$, at its output as the amplified signal 545. However, when operated in the nonlinear operating region, the linear amplifier 144 generates the original linear combination of two fundamental frequencies $f_1$ and $f_2$ plus intermodulation products that appear at their sum $f_S = f_1 + f_2$ and difference $f_D = f_2 - f_1$ frequencies. When the two components of the probe signal 143 increase in amplitude, the intermodulation components increase disproportionately as the linear amplifier 144's dynamic range is exceeded. Moreover, if the linear amplifier 144 gets into such an overdriven nonlinear operating region, the above-noted feedback signals 157-$b$, 157-$a$ or 157-$c$ can be utilized to respectively adjust the linear amplifier 144's gain to keep the two-tone amplified signal 545 within a desired range or adjust the exciter 130's drive level, or the oscillator module 546's drive level to keep the two-tone probe signal 143 within a desired range.

In the example illustrated in FIG. 5A, the feedback module 150 includes a spectrum analyzer module 152 and a controller module 156. The spectrum analyzer module 152 spectrally analyzes the amplified signal 545 and to generate spectral information 555 of the amplified signal. Here, the spectral information 555 about the amplified signal includes a spectrum of the amplified signal. (Note that the spectrum of the amplified signal is also denoted as 555.) For example, the undistorted two-tone amplified signal 545 has a spectrum 555 with (i) a first spectral component at the first frequency $f_1$, and (ii) a second spectral component at the second frequency $f_2$. When the amplified signal 545 includes distortion, its spectrum 555 features (i) the first spectral component at the first frequency $f_1$, (ii) the second spectral component at the second frequency $f_2$, and either of (iii) a sum-frequency spectral component at a sum of the first and second frequencies, $f_S = f_1 + f_2$, or (iv) a difference-frequency spectral component at a difference of the first and second frequencies, $f_D = f_2 - f_1$.

The controller module 156 determines whether distortion is present in the amplified signal 545 based on whether a combination (denoted "Combo") of spectral amplitudes of the sum-frequency components, $\delta S_1$ & $\delta S_2$, and difference frequency components, $\delta D_1$ & $\delta D_2$, exceeds a threshold value, $V_0$. Hence, the controller module 156 determines that the linear amplifier 144 operates in a linear regime when Combo $\leq V_0$, and in an overdriven, nonlinear operating regime when Combo $> V_0$. A first difference between amplitudes of the first spectral component and the sum-frequency spectral component is defined as $\delta S_1 = A(t) - A(f_1 + f_2)$. A second difference between amplitudes of the second spectral component and the sum-frequency spectral component is defined as $\delta S_2 = A(f_2) - A(f_1 + f_2)$. The first and second differences $\delta S_1$ & $\delta S_2$ are shown in FIG. 5A. A first difference between amplitudes of the first spectral component and the difference-frequency spectral component is defined as $\delta D_1 = A(f_1) - A(f_1 - f_2)$. A second difference between amplitudes of the second spectral component and the difference-frequency spectral component is defined as $\delta D_2 = A(f_2) - A(f_1 - f_2)$. In some implementations, when the spectrum 555 includes only spectral components at $f_1$, $f_2$ and $f_S$, (e.g., $f_D$ can be eliminated by using a high-pass filter), then Combo can be defined either as Sum($|\delta S_1|, |\delta S_2|$) or as RMS($\delta S_1, \delta S_2$). In other implementations, when the spectrum 555 includes only spectral components at $f_1$, $f_2$ and $f_D$, (e.g., $f_S$ can be eliminated by using a low-pass filter), then Combo can be defined either as Sum($|\delta D_1|, |\delta D_2|$) or as RMS($\delta D_1, \delta D_2$). In some other implementations, when the spectrum 555 includes all spectral components at $f_1$, $f_2$ $f_S$ and $f_D$, then Combo can be defined either as Sum($|\delta S_1|, |\delta S_2|, |\delta D_1|, |\delta D_2|$) or as RMS($\delta S_1, \delta S_2, \delta D_1, \delta D_2$). The third implementations use (twice) more data than each of the first and second implementations, so the third implementations provide distortion detection with higher sensitivity with respect to each of the first and second implementations.

Signals at the two original spectral components $f_1$ and $f_2$ are used as part of the well logging tool 120's intended measurement. Combinations of amplitudes (e.g., Combos defined above in terms of $\delta S_1$, $\delta S_2$, $\delta D_1$, $\delta D_2$) of the intermodulation components (e.g., $f_S = f_1 + f_2$ and/or $f_D = f_1 - f_2$) can be used for regulating either the excitation source 130's power, the oscillation module 546's amplitude or a gain of the linear amplifier 144.

In some implementations, when the intermodulation components fall below a predetermined level, such that Combo $\leq V_0$, the controller module 156 issues an instruction 157-$a$ to the excitation source 130 to increase the excitation signal 133, in order to improve the quality of the measurement performed by the well logging tool 120. When the intermodulation components exceed a predetermined level, such that Combo $> V_0$, receiver compression is occurring. In the latter case, the controller module 156 issues another instruction 157-$a$ to the excitation source 130 to reduce the excitation signal 133, in order for linear operation of the linear amplifier 140 to be reestablished. In this manner, feedback instructions 157-$a$ can be sent to the excitation source 130 to maintain either a constant or an acceptable range of intermodulation levels.

In some implementations, when the intermodulation components fall below a predetermined level, such that Combo $\leq V_0$, the controller module 156 issues an instruction 157-$c$ to the oscillator module 546 to increase the oscillation 547, in order to improve the quality of the measurement performed by the well logging tool 120. When the intermodulation components exceed a predetermined level, such that Combo $> V_0$, the controller module 156 issues another instruction 157-$c$ to the oscillator module 546 to reduce the amplitude of the oscillation 547, in order for linear operation of the linear amplifier 140 to be reestablished. In this manner, feedback instructions 157-$c$ can be sent to the oscillator module 546 to maintain either a constant or an acceptable range of intermodulation levels.

In some implementations, when the intermodulation components fall below a predetermined level, such that Combo $\leq V_0$, the controller module 156 issues an instruction 157-$b$ to the linear amplifier 144 to increase an amplifier gain, in order to improve the quality of the measurement performed by the well logging tool 120. When the intermodulation components exceed a predetermined level, such that Combo $> V_0$, the controller module 156 issues another instruction 157-$b$ to the linear amplifier 144 to reduce the amplifier gain, in order for linear operation of the linear amplifier 144 to be reestablished. In this manner, feedback instructions 157-b can be sent to the linear amplifier 144 to maintain either a constant or an acceptable range of intermodulation levels.

The system 500 configured with the spectral analysis-based feedback described in connection with FIGS. 5A-5C can be operated based on a process described below.

Figure 6:
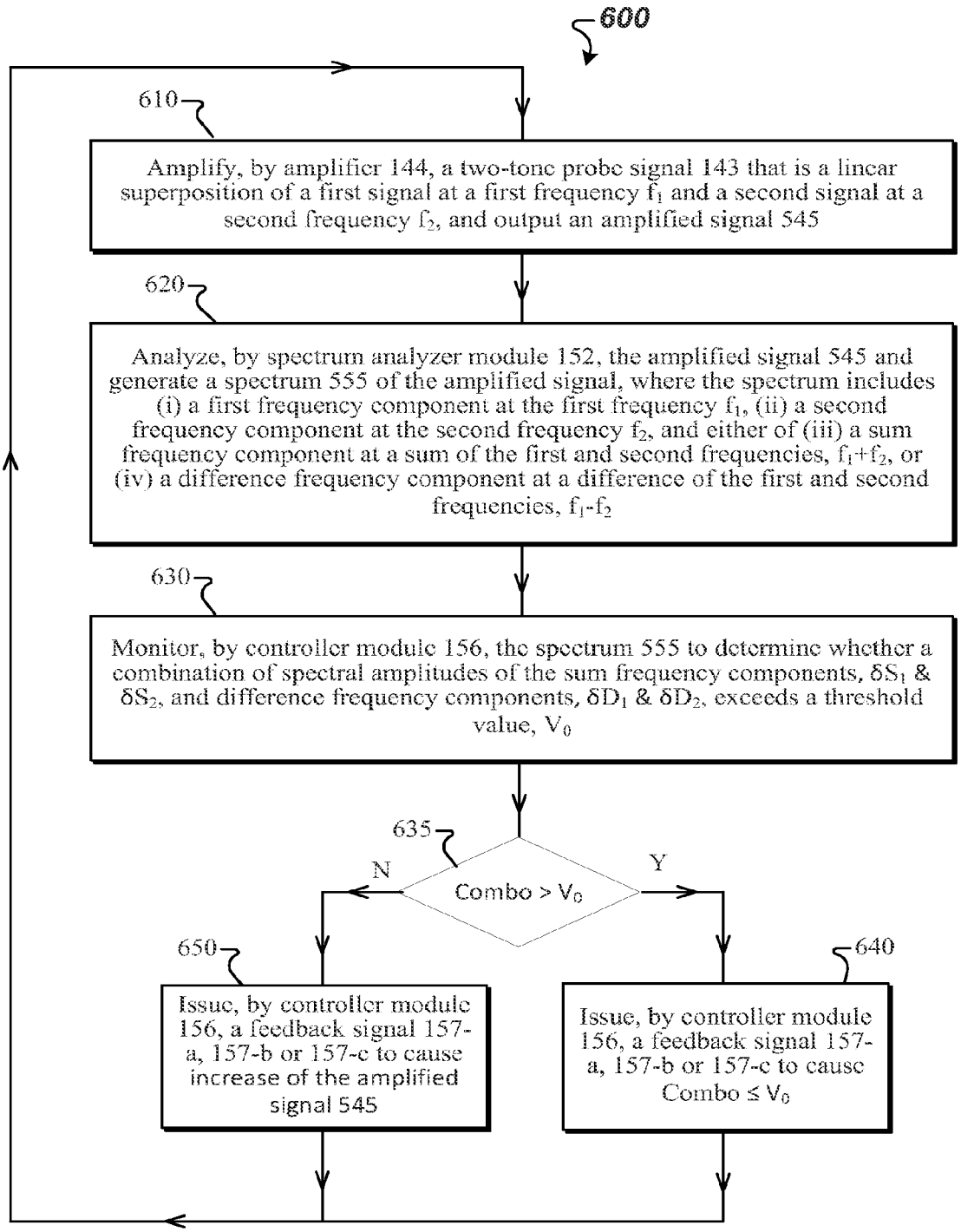
FIG. 6 is a flow chart showing another example of a process for detecting distortion of an amplified signal based on spectral analysis thereof, where the amplified signal is a result of amplification of a multi-frequency signal.

FIG. 6 is a flow chart showing another example of a process 600 for detecting distortion of an amplified signal based on spectral analysis thereof, where the amplified signal is a result of amplification of a multi-tone probe signal. The process 600 can be implemented in the well logging system 100, 100', 100" and/or system 500.

At 610, a multi-tone probe signal is amplified and is output as an amplified signal. For simplicity, the process 600 is explained in terms of a multi-tone probe signal that is a linear superposition of a first signal at a first frequency $f_1$ and a second signal at a second frequency $f_2$. Such multi-tone probe signal is referred to as a two-tone probe signal. Moreover, the process 600 can be implemented for multi-tone probe signals which include linear combinations of three or more single-tone signals. In the example illustrated in FIGS. 5A-5C, a linear amplifier 144 amplifies the two-tone probe signal 143 and outputs the amplified signal 545. In some implementations, the two-tone probe signal 143 corresponds to a probe signal 137 that is a linear superposition of the first signal at the first frequency $f_1$ and the second signal at the second frequency $f_2$. In other implementations, the two-tone probe signal 143 is a linear superposition of the probe signal 137 at the first frequency $f_1$ and an oscillation 547 at the second frequency $f_2$.

At 620, the amplified signal is spectrally analyzed and a spectrum of the amplified signal is generated based on the spectral analysis. The spectrum includes (i) a first frequency component at the first frequency $f_1$, (ii) a second frequency component at the second frequency $f_2$, and either of (iii) a sum frequency component at a sum of the first and second frequencies, $f_1+f_2$, or (iv) a difference frequency component at a difference of the first and second frequencies, $f_1-f_2$. In the example illustrated in FIG. 5A, spectral analysis of the amplified signal 545 is performed by a spectrum analyzer module 152 to generate a spectrum 555 of the amplified signal.

At 630, the spectrum of the amplified signal is monitored to determine whether a combination of spectral amplitudes of the sum frequency components and difference frequency components exceeds a threshold value. In the example illustrated in FIG. 5A, a controller module 156 measures the combination of spectral amplitudes of the sum frequency components, $\delta S_1$ and $\delta S_2$, and difference frequency components, $\delta D_1$ and $\delta D_2$, (defined above in connection with FIG. 5A) relative to the threshold value, $V_0$.

At 635, a determination can be made that the combination of spectral amplitudes of the sum frequency components and difference frequency components (e.g., Combo) exceeds a threshold value (e.g., $V_0$.) If so, at 640, a feedback signal is issued to cause Combo$\leq V_0$. In the example illustrated in FIG. 5A, the feedback module 150 issues the feedback signal. In some implementations, a first feedback signal 157-a is issued to an excitation source 130 requesting reduction of the excitation, such that the excitation reduction causes Combo$\leq V_0$. In some implementations, a second feedback signal 157-c is issued to an oscillator module 546 requesting reduction of the oscillation, such that the oscillation reduction causes Combo$\leq V_0$. In some implementations, a third feedback signal 157-b is issued to the linear amplifier 144 requesting reduction of amplifier gain, such that the amplifier gain reduction causes Combo$\leq V_0$.

Alternatively at 635, another determination can be made that the combination of spectral amplitudes of the sum frequency components and difference frequency components (e.g., Combo) is less than or equal to the threshold value (e.g., $V_0$.) In this alternative case, at 650, a feedback signal is issued to cause an increase of the amplified signal. In the example illustrated in FIG. 5A, the controller module 156 conditionally issues the feedback signal. If the amplifier gain is below a maximum value, the third feedback signal 157-b is issued to the linear amplifier 144 requesting an increase of the amplifier gain, e.g., by a predetermined gain increment. If the amplifier gain has a maximum value, the second feedback signal 157-c is issued to the excitation source 130 requesting an increase of the excitation, e.g., by a predetermined excitation increment, or the first feedback signal 157-a is issued to the oscillator module 156 requesting an increase of the oscillation, e.g., by a predetermined oscillation increment.

After completion of either 640 or 650, another iteration of the process 600 can be performed by the system 500.

Some embodiments have been described in detail above, and various modifications are possible. While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Other embodiments fall within the scope of the following claims.

What is claimed is:

1. A well logging system comprising,
  a well logging tool comprising
    an excitation source to direct an excitation signal towards an environment adjacent a wellbore, wherein the excitation signal is a linear superposition of a first signal at a first frequency and a second signal at a second frequency, and
    a receiver to amplify the excitation signal that interacted with the environment adjacent the wellbore prior to being received by the receiver; and
  a feedback module to receive the amplified signal, the feedback module comprising:
    a spectrum analyzer module to generate a spectrum of the amplified signal, wherein the spectrum of the amplified signal comprises (i) a first frequency component at the first frequency, (ii) a second frequency component at the second frequency, (iii) a sum frequency component at a sum of the first and second frequencies, and (iv) a difference frequency component at a difference of the first and second frequencies, and
a controller module to determine, from the spectrum of the amplified signal, whether a combination of a spectral amplitude of the sum frequency component and a spectral amplitude of the difference frequency component exceeds a threshold value, and if so, to issue a feedback signal to the excitation source or the receiver to cause at least a reduction of the combined sum and difference spectral amplitudes.

2. The well logging system of claim 1, wherein the well logging tool comprises the feedback module.

3. A method of well logging, the method comprising:
directing an excitation signal to an environment adjacent a wellbore, wherein the excitation signal is a linear superposition of a first signal at a first frequency and a second signal at a second frequency;
receiving the excitation signal that interacted with the environment adjacent the wellbore;
amplifying the received signal to provide an amplified signal;
generating a spectrum of the amplified signal, wherein the spectrum of the amplified signal comprises (i) a first frequency component at the first frequency, (ii) a second frequency component at the second frequency, (iii) a sum frequency component at a sum of the first and second frequencies, and (iv) a difference frequency component at a difference of the first and second frequencies;
determining, based on the spectrum of the amplified signal, that a combination of a spectral amplitude of the sum frequency component and a spectral amplitude of the difference frequency component exceeds a threshold value;
issuing, in response to the determining, a feedback signal to cause at least a reduction of the combined sum and difference spectral amplitudes, wherein the reduction corresponds to an adjusted amplified signal; and
logging, by a computer system, information about the environment adjacent the wellbore based on the adjusted amplified signal.

4. A system, comprising:
a receiver to amplify a probe signal received from a target, and to output an amplified signal, wherein the probe signal is a linear superposition of a first signal at a first frequency $f_1$ and a second signal at a second frequency $f_2$, the first frequency $f_1$ and the second frequency $f_2$ satisfy the following conditions: (i) $f_1 < f_2$, and (ii) $0.05 f_2 \leq (f_2 - f_1) \leq 0.2 f_2$; and
a feedback module to receive the amplified signal, the feedback module comprising
a spectrum analyzer module to generate a spectrum of the amplified signal, wherein the spectrum of the amplified signal comprises (i) a first frequency component at the first frequency $f_1$, (ii) a second frequency component at the second frequency $f_2$, (iii) a sum frequency component at a sum of the first and second frequencies $(f_1+f_2)$, and (iv) a difference frequency component at a difference of the first and second frequencies $(f_2-f_1)$, and
a controller module to determine, from the spectrum of the amplified signal, whether a combination of a spectral amplitude of the sum frequency component and a spectral amplitude of the difference frequency component exceeds a threshold value, and if so, to issue a feedback signal to cause at least a reduction of the combined sum and difference spectral amplitudes.

5. The system of claim 4, further comprising:
an excitation source to direct an excitation signal to the target,
wherein the probe signal represents at least a portion of the excitation signal that interacted with the target prior to being received by the receiver, and
wherein the feedback signal is issued to the excitation source and comprises a request to decrease the excitation.

6. The system of claim 4, wherein the receiver comprises a linear amplifier, and
the feedback signal is issued to the linear amplifier and comprises a request to decrease an amplifier gain.

7. The system of claim 4, wherein the receiver comprises the feedback module.

8. The system of claim 4 further comprising
an excitation source to direct an excitation signal to the target, wherein the probe signal represents at least a portion of the excitation signal that interacted with the target prior to being received by the receiver; and
a tool string, wherein the tool string comprises the excitation source and the receiver,
wherein the target comprises one or more of a wellbore fluid or a geological formation.

9. The system of claim 8, wherein the tool string further comprises the feedback module.

10. The well logging tool of claim 1, wherein the first frequency and the second frequency are frequencies in an audio frequency range of an electromagnetic spectrum from 20 Hz to 30 kHz.

11. The well logging tool of claim 1, wherein the first frequency and the second frequency are frequencies in a ground-penetrating-radar range of an electromagnetic spectrum from 1 GHz to 10 GHz.

12. The well logging tool of claim 1, wherein the first frequency and the second frequency are frequencies in a very high frequency (VHF) range of an electromagnetic spectrum from 30 MHz to 300 MHz.

13. The well logging tool of claim 1, wherein the first frequency and the second frequency are frequencies in an ultrahigh frequency (UHF) range of an electromagnetic spectrum from 300 MHz to 3 GHz.

14. The well logging tool of claim 1, wherein the first frequency and the second frequency are frequencies in a gamma frequency range of an electromagnetic spectrum from $10^{20}$ Hz to $10^{24}$ Hz.

15. The well logging tool of claim 1, wherein the first frequency and the second frequency are frequencies in an acoustic range of a sound spectrum from 20 Hz to 20 kHz.

16. The well logging tool of claim 1, wherein the first frequency and the second frequency are frequencies in an ultrasound range of a sound spectrum from 20 kHz to 10 MHz.

17. The well logging tool of claim 1, wherein
the controller module issues the feedback signal to the excitation source, and
the feedback signal comprises a request to decrease the excitation signal.

18. The well logging tool of claim 1, wherein
the receiver comprises a linear amplifier,
the controller module issues the feedback signal to the linear amplifier, and
the feedback signal comprises a request to decrease an amplifier gain.

19. The method of claim 3, wherein
the feedback signal comprises a request to decrease the excitation signal, and
the issuing of the feedback signal comprises transmitting the request to an excitation source that performs the directing of the excitation signal to the environment adjacent the wellbore.

20. The method of claim 3, wherein
the feedback signal comprises a request to decrease an amplifier gain, and
the issuing of the feedback signal comprises transmitting the request to a linear amplifier that performs the amplifying of the excitation signal that interacted with the environment adjacent the wellbore.

* * * * *